US008016469B2

(12) United States Patent
Takeda et al.

(10) Patent No.: US 8,016,469 B2
(45) Date of Patent: Sep. 13, 2011

(54) LIGHT EMITTING MODULE AND LIGHTING DEVICE FOR VEHICLE

(75) Inventors: Hitoshi Takeda, Shizuoka (JP); Tsukasa Tokida, Shizuoka (JP); Kazunori Watanabe, Tokushima (JP); Masato Ono, Tokushima (JP)

(73) Assignees: Koito Manufacturing Co., Ltd., Tokyo (JP); Nichia Corporation, Tokushima (JP)

( * ) Notice: Subject to any disclaimer, the term of this patent is extended or adjusted under 35 U.S.C. 154(b) by 333 days.

(21) Appl. No.: 11/825,586

(22) Filed: Jul. 6, 2007

(65) Prior Publication Data
US 2008/0008427 A1 Jan. 10, 2008

(30) Foreign Application Priority Data

Jul. 7, 2006 (JP) ................... 2006-187469

(51) Int. Cl.
*F21V 7/04* (2006.01)
(52) U.S. Cl. .......... 362/543; 362/545; 362/549; 257/99; 257/690; 257/E33.062; 257/E33.066
(58) Field of Classification Search ................ 362/545, 362/547, 548, 800, 294, 373; 257/99, 690, 257/E33.062, E33.066
See application file for complete search history.

(56) References Cited

U.S. PATENT DOCUMENTS

| 4,965,659 | A | * | 10/1990 | Sasame et al. | 257/720 |
|---|---|---|---|---|---|
| 5,640,045 | A | * | 6/1997 | Krausse, III | 257/705 |
| 6,087,586 | A | * | 7/2000 | Chen | 174/556 |
| 6,582,100 | B1 | * | 6/2003 | Hochstein et al. | 362/294 |
| 6,999,318 | B2 | * | 2/2006 | Newby | 361/719 |
| 7,035,106 | B2 | * | 4/2006 | Youm et al. | 361/709 |
| 7,211,835 | B2 | * | 5/2007 | Ono | 257/99 |
| 2005/0007783 | A1 | * | 1/2005 | Ono | 362/294 |

FOREIGN PATENT DOCUMENTS

| JP | 06-309904 A | 11/1994 |
|---|---|---|
| JP | 2005-209536 | 8/2005 |
| JP | 2006-66108 | 3/2006 |
| WO | WO 2004/068909 | * 8/2004 |

OTHER PUBLICATIONS

Patent Abstracts of Japan, Publication No. 2006-066108, Publication Date: Mar. 9, 2006, 1 page.
Office Action of Japan with Patent Application No. 2006-187469, dated Sep. 16, 2010, with English translation thereof (6 pages).
Patent Abstract, via espacenet, for Publication No. 2005209536, Publication date Aug. 4, 2005, (1 page).
Office Action in Japan Application No. 2006-187469, Dated Feb. 1, 2011 (6 Pages With English Translation).

* cited by examiner

*Primary Examiner* — John A Ward
(74) *Attorney, Agent, or Firm* — Osha • Liang LLP

(57) ABSTRACT

A ceramic board is formed in an almost rectangular shape and has one side surface of an outer peripheral surface formed as an abutting surface, which is caused to abut on positioning surfaces of a radiating member, and one surface in a vertical direction formed as a device disposing surface on which a semiconductor light emitting device is to be disposed. Predetermined conductive patterns are formed on the ceramic board. A light emitting portion has a semiconductor light emitting device. A pair of positive and negative planar electrode portions are formed on the ceramic board and connected to the semiconductor light emitting device through the conductive patterns. At least a part of the pair of planar electrode portions are set to be exposure regions exposed to the device disposing surface of the ceramic board and the exposure regions are positioned in portions other than a portion linked to the abutting surface in an outer peripheral portion of the device disposing surface.

15 Claims, 8 Drawing Sheets

LIGHT EMITTING MODULE AND LIGHTING DEVICE FOR VEHICLE

BACKGROUND OF INVENTION

1. Field of the Invention

The present invention relates to a light emitting module and a lighting device for a vehicle, and more particularly to the forming of exposure regions of a pair of planar electrode portions in predetermined positions of a ceramic board.

2. Background Art

Some light emitting modules use a semiconductor light emitting device such as a light emitting diode (LED) as a light source. By way of example, the light emitting module is provided in a lighting device for a vehicle which irradiates, as an illuminating light, a light emitted from the light source by means of a projection lens (for example, see Patent Document 1).

In the light emitting module described in the Patent Document 1, one side surface of outer peripheral surfaces of a radiating board is fixed to a radiating member formed by a metal material having a high thermal conductivity (a light source pedestal 50a in the Patent Document 1) in an abutting state on a predetermined surface of the radiating member.

The radiating board is provided with a planar electrode portion for supplying power to a semiconductor light emitting device (contact points 46 and 46 in the Patent Document 1) on the whole of both ends in an orthogonal direction to an abutting direction on the radiating member, respectively.

[Patent Document 1] JP-A-2006-66108 Publication

SUMMARY OF INVENTION

In the light emitting module described in the Patent Document 1, however, the planar electrode portion is formed on the whole of both ends in the orthogonal direction to the abutting direction of the radiating member of the radiating board. For this reason, there is a possibility that in a state in which the planar electrode portion abuts the predetermined surface of the radiating member and is fixed to the radiating member, each of the ends of the planar electrode portion might come into contact with the radiating member to cause a short circuit.

Particularly in the case in which moisture and foreign substances stick to each of the ends of the planar electrode portion or the predetermined surface of the radiating member, the moisture and foreign substances can connect each of the ends to the predetermined surface. For this reason, there is an increased possibility that a short circuit might be caused.

Therefore, a light emitting module and a lighting device for a vehicle according to one or more embodiments of the invention prevent the generation of a short circuit.

One or more embodiments of the invention provide a light emitting module comprising a ceramic board formed in an almost rectangular shape and having one side surface of an outer peripheral surface formed as an abutting surface, which is caused to abut on a positioning surface of a radiating member, one surface in a vertical direction formed as a device disposing surface, and another surface in the vertical direction formed as a radiating surface, which is provided in face contact with the radiating member to radiate heat, a predetermined conductive pattern formed on the ceramic board, a light emitting portion, having a semiconductor light emitting device, disposed on the device disposing surface of the ceramic board and connected to the conductive pattern, and a pair of planar electrode portions formed on the ceramic board and connected to the semiconductor light emitting device through the conductive pattern, wherein at least a part of the pair of planar electrode portions are set to be exposure regions, which are exposed to the device disposing surface of the ceramic board, and the exposure regions of the pair of planar electrode portions are positioned in portions other than a portion linked to the abutting surface in an outer peripheral portion of the device disposing surface.

One or more embodiments of the invention provide a lighting device for a vehicle comprising a radiating member having a positioning surface and formed by a predetermined metal material, a ceramic board formed in an almost rectangular shape and having one side surface of an outer peripheral surface formed as an abutting surface, which is caused to abut on the positioning surface of the radiating member, one surface in a vertical direction formed as a device disposing surface, and another surface in the vertical direction formed as a radiating surface which is provided in face contact with the radiating member to radiate heat, a predetermined conductive pattern formed on the ceramic board, a light emitting portion having a semiconductor light emitting device, disposed on the device disposing surface of the ceramic board and connected to the conductive pattern, a pair of planar electrode portions formed on the ceramic board and connected to the semiconductor light emitting device through the conductive pattern, a feeding attachment for holding the ceramic board and feeding a power to the semiconductor light emitting device through the pair of planar electrode portions and the conductive pattern, and an optical member for irradiating the light emitted from the semiconductor light emitting device as an illuminating light, wherein at least a part of the pair of planar electrode portions are set to be exposure regions, which are exposed to the device disposing surface of the ceramic board, and the exposure regions of the pair of planar electrode portions are positioned in portions other than a portion linked to the abutting surface in an outer peripheral portion of the device disposing surface.

In the light emitting module and the lighting device for a vehicle according to embodiments of the invention, accordingly, the exposure regions of the pair of planar electrode portions are not present in a portion linked to the abutting surface in the outer peripheral portion of the device disposing surface.

One or more embodiments of the invention provide a light emitting module, which is used in a lighting device for a vehicle and is fixed to a radiating member in an abutting and positioning state to a positioning surface formed on the radiating member, comprising a ceramic board formed in an almost rectangular shape and having one side surface of an outer peripheral surface formed as an abutting surface, which is caused to abut on the positioning surface of the radiating member, one surface in a vertical direction formed as a device disposing surface, and another surface in the vertical direction formed as a radiating surface, which is provided in face contact with the radiating member to radiate heat, a predetermined conductive pattern formed on the ceramic board, a light emitting portion having a semiconductor light emitting device, disposed on the device disposing surface of the ceramic board and connected to the conductive pattern, and a pair of planar electrode portions formed on the ceramic board and connected to the semiconductor light emitting device through the conductive pattern, wherein at least a part of the pair of planar electrode portions are set to be exposure regions, which are exposed to the device disposing surface of the ceramic board, and the exposure regions of the pair of planar electrode portions are positioned in portions other than a portion linked to the abutting surface in an outer peripheral portion of the device disposing surface.

In the positioning and fixing state to the radiating member, accordingly, it is possible to prevent the generation of a short circuit without causing the planar electrode portion to come in contact with the radiating member.

According to a second aspect of embodiments of the invention, the pair of planar electrode portions are formed in the outer peripheral portion positioned on an opposite side with the semiconductor light emitting device interposed therebetween. Therefore, a design can easily be carried out for a position in which the feeding terminal of the feeding attachment is formed. Consequently, it is possible to facilitate the design.

According to a third aspect of embodiments of the invention, a part of the pair of planar electrode portions are covered with an insulating layer to form a non-exposure region, which is not exposed to the device disposing surface of the ceramic board. Therefore, it is possible to easily form the exposure region and the non-exposure region.

One or more embodiments of the invention provide a lighting device for a vehicle in which a light emitted from a semiconductor light emitting device of a light emitting module disposed in a lamp housing is irradiated as an illuminating light by means of a projection lens, comprising a radiating member having a positioning surface and formed by a predetermined metal material, a ceramic board formed in an almost rectangular shape and having one side surface in an outer peripheral surface formed as an abutting surface, which is caused to abut on the positioning surface of the radiating member, one surface in a vertical direction formed as a device disposing surface, and another surface in the vertical direction formed as a radiating surface, which is provided in face contact with the radiating member to radiate heat, a predetermined conductive pattern formed on the ceramic board, a light emitting portion having a semiconductor light emitting device, disposed on the device disposing surface of the ceramic board and connected to the conductive pattern, a pair of planar electrode portions formed on the ceramic board and connected to the semiconductor light emitting device through the conductive pattern, a feeding attachment for holding the ceramic board and feeding a power to the semiconductor light emitting device through the pair of planar electrode portions and the conductive pattern, and an optical member for irradiating the light emitted from the semiconductor light emitting device as an illuminating light, wherein at least a part of the pair of planar electrode portions are set to be exposure regions, which are exposed to the device disposing surface of the ceramic board, and the exposure regions of the pair of planar electrode portions are positioned in portions other than a portion linked to the abutting surface in an outer peripheral portion of the device disposing surface.

In the positioning and fixing state to the radiating member, accordingly, it is possible to prevent the generation of a short circuit without causing the planar electrode portion to come in contact with the radiating member.

Other aspects and advantages of the invention will be apparent from the following description and the appended claims.

DETAILED DESCRIPTION

Embodiments of a light emitting module and a lighting device for a vehicle according to the invention will be described below with reference to the accompanying drawings.

Figure 1:
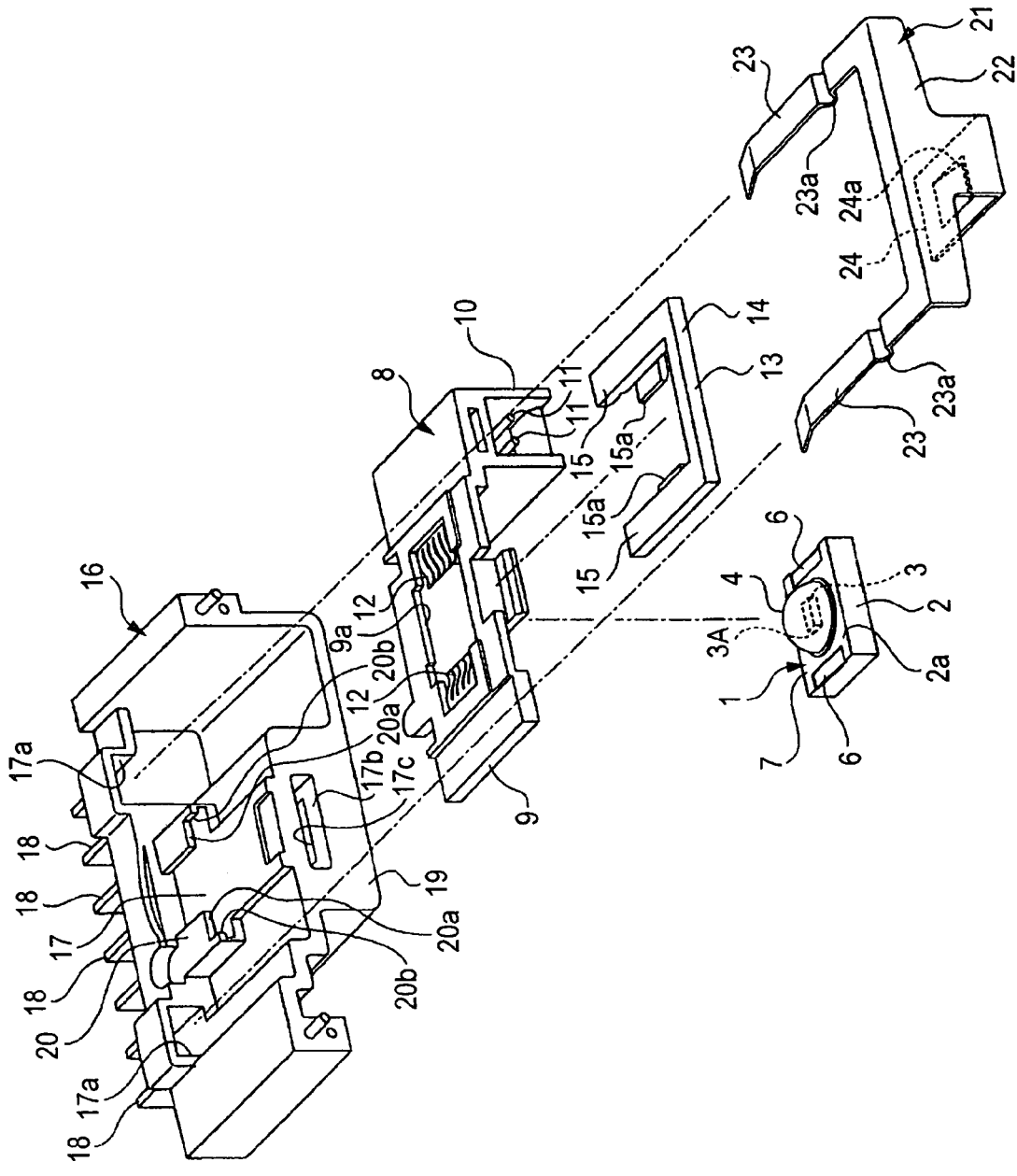
FIG. 1 is an exploded perspective view showing the best mode according to the invention together with FIGS. 2 to 9, illustrating each portion.

A light emitting module 1 comprises a ceramic board 2, a semiconductor light emitting device 3 such as an LED (light emitting diode) chip, and a cover 4 (see FIG. 1).

The ceramic board 2 is formed in a rectangular shape, for example, a shape of an oblong rectangle. For the ceramic board 2, various boards such as an aluminum nitride ceramic board, an alumina ceramic board, a mullite ceramic board, and a glass ceramic board are used.

Figure 2:
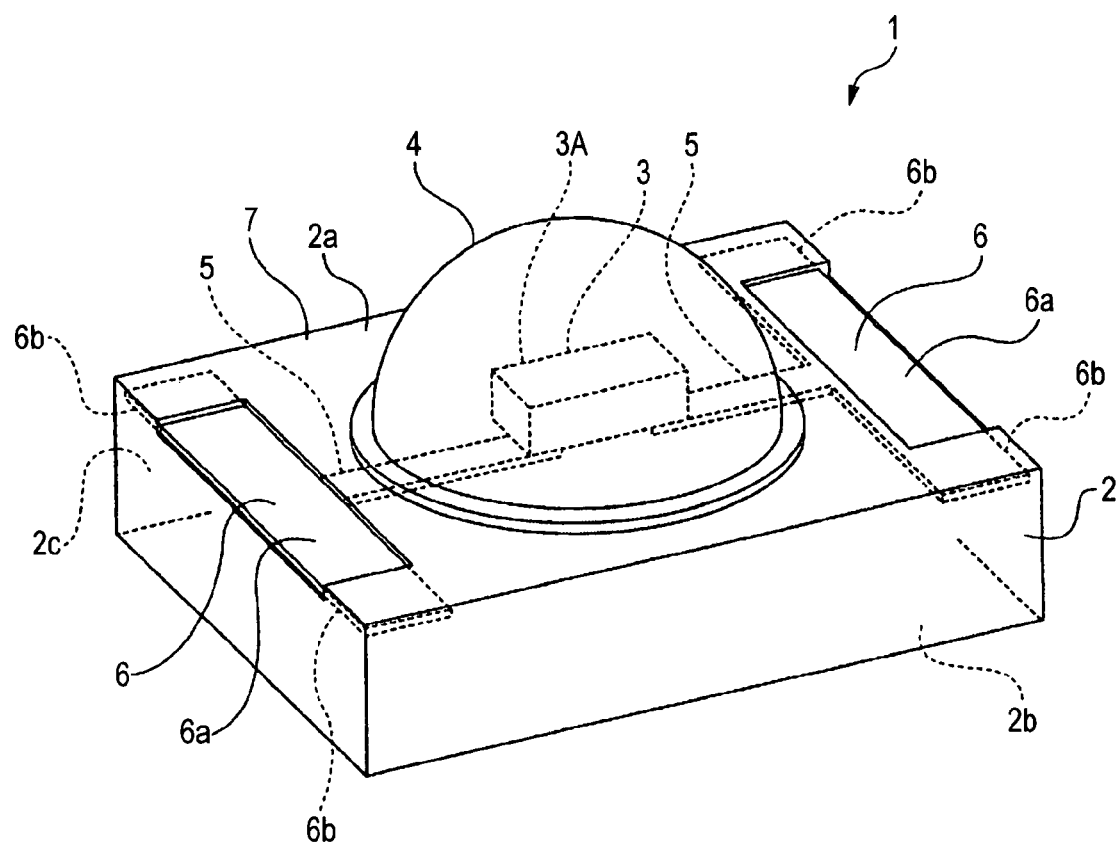
FIG. 2 is an enlarged perspective view showing a light emitting module.

Two directions, which are orthogonal to each other in a vertical direction and along which respective side edges are extended, are set to be a first direction (a long direction) and a second direction (a short direction) in the ceramic board 2 (see FIG. 2). One of the surfaces (an upper surface) in the vertical direction is formed as a device disposing surface 2*a* on which the semiconductor light emitting device 3 is to be disposed. The other surface (a lower surface) in the vertical direction is formed as a radiating surface 2*b*. One of the surfaces (a rear surface) in the second direction in an outer peripheral surface is formed as an abutting surface 2*c* for abutting a radiating member, which will be described below.

A pair of conductive patterns 5 and 5 extended in the first direction are formed on the ceramic board 2 (see FIG. 2).

Planar electrode portions 6 and 6 are linked to the conductive patterns 5 and 5 at both ends in the first direction of the ceramic board 2, respectively. The planar electrode portions 6 and 6 are constituted by exposure regions 6*a* and 6*a*, which are exposed to the device disposing surface 2*a* of the ceramic board 2, and non-exposure regions 6*b*, 6*b*, . . . , which are not exposed, respectively.

The exposure regions 6*a* and 6*a* are positioned in portions other than both ends in the second direction of the ceramic board 2, and the non-exposure regions 6*b*, 6*b*, . . . are positioned on both ends in the second direction of the ceramic board 2. The non-exposure regions 6*b*, 6*b*, . . . are formed by covering a part of the planar electrode portions 6 and 6 with an insulating layer 7, for example.

End faces on a Y1 side (see FIG. 2) in the second direction of the planar electrode portions 6 and 6 are covered with the insulating layer, but are not exposed to the abutting surface 2*c*, for example. Moreover, both end faces in the first direction of the planar electrode portions 6 and 6 are also covered with the insulating layer, for example.

For the semiconductor light emitting device 3, for example, a light emitting diode coated with a fluorescent material like a uniform film is used. The semiconductor light emitting device 3 is disposed on the device disposing surface 2a of the ceramic board 2 in a mounting state on the conductive patterns 5 and 5 or through a submount provided across the conductive patterns 5 and 5. In the case in which the semiconductor light emitting device 3 is not disposed on the submount, it alone functions as a light emitting portion 3A. In the case in which the semiconductor light emitting device 3 is disposed on the submount, it functions as the light emitting portion 3A together with the submount.

The light emitting portion 3A may have only one semiconductor light emitting device 3, and furthermore, a plurality of semiconductor light emitting devices 3, 3, . . . , for example, semiconductor light emitting devices 3, 3, . . . formed as a square may be arranged in a line and formed in a rectangular shape.

The light emitting portion 3A is formed as an oblong rectangle, for example, and is disposed in such a manner that a longitudinal direction is coincident with the longitudinal direction of the ceramic board 2 (see FIG. 2).

The cover 4 has an external surface formed as an almost semicircular shape, and is bonded to the device disposing surface 2a of the ceramic board 2 in order to cover the semiconductor light emitting device 3 (see FIGS. 1 and 2). The cover 4 is bonded to the ceramic board 2 so that the light emitting portion 3A is disposed in a hollow closed region in the cover 4.

Figure 3:
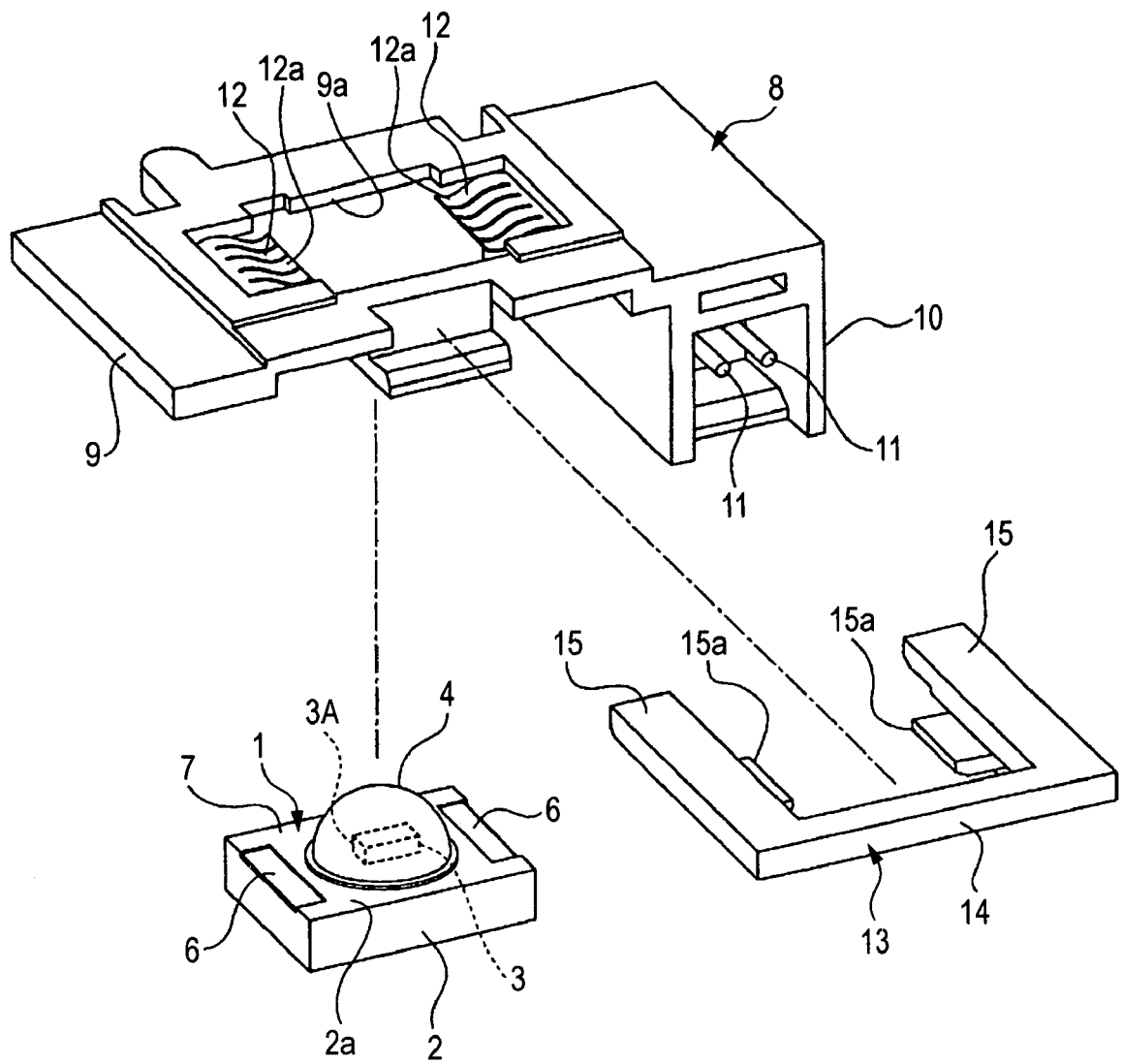
FIG. 3 is an exploded perspective view showing the light emitting module, a feeding attachment and a holder.

The light emitting module 1 is connected and fixed to a feeding attachment 8 (see FIG. 3). In the feeding attachment 8, respective portions are integrally formed by a resin material except for a conducted portion, and have a base surface portion 9 formed almost planar turned in a vertical direction and a protruded portion 10, which is protruded downward from one of the ends of the base surface portion 9.

The base surface portion 9 is provided with a disposing hole 9a taking an almost rectangular shape.

The protruded portion 10 is provided with feeding portions 11 and 11. The feeding portions 11 and 11 are connector terminals to be connected to an external power supply, for example.

The feeding attachment 8 is provided with feeding terminals 12 and 12. The feeding terminals 12 and 12 are integrally formed by the same material as the feeding portions 11 and 11, and ends are protruded in such a direction as to approach each other in the disposing hole 9a from an inner peripheral surface of the feeding attachment 8 and the other ends are connected to the feeding portions 11 and 11, respectively. The ends of the feeding terminals 12 and 12 are provided as connecting portions 12a and 12a constituted by a plurality of leaf springs.

The light emitting module 1 is fixed to the feeding attachment 8 by means of a holder 13. The holder 13 has a base portion 14 extended transversely and side portions 15 and 15 protruded rearward from both left and right ends of the base portion 14, and the side portions 15 and 15 provided with receiving protruded portions 15a and 15a, which are protruded in such a direction as to approach each other.

Figure 4:
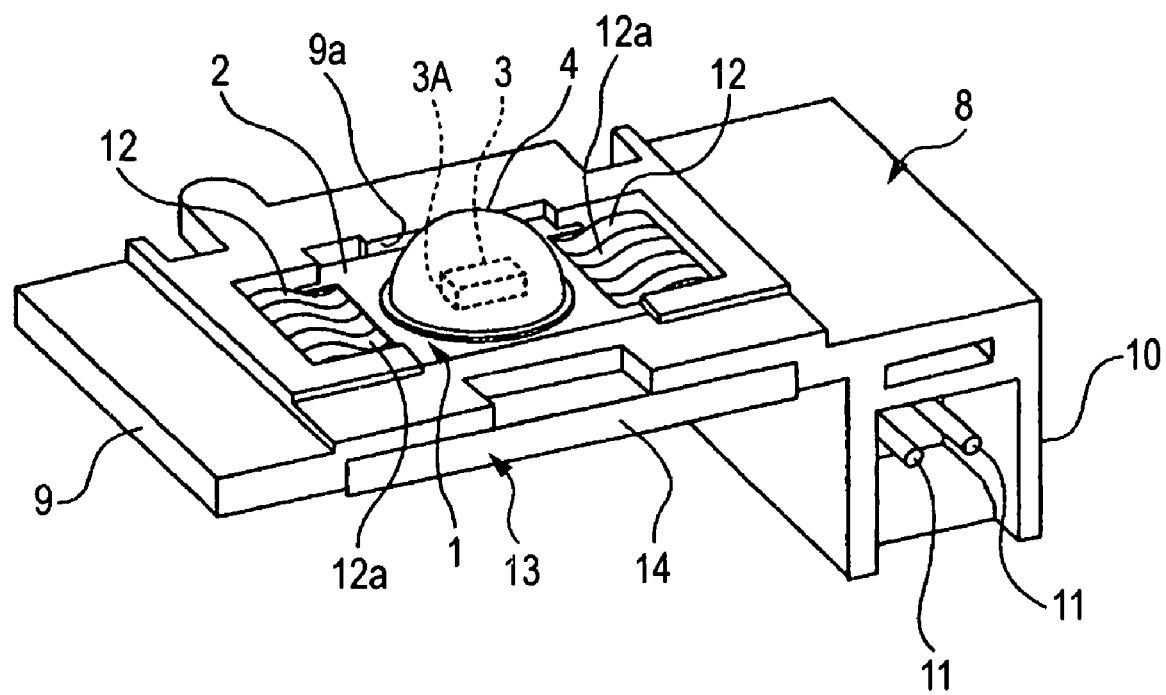
FIG. 4 is a perspective view showing a state in which the light emitting module is fixed to the feeding attachment by means of the holder.

The light emitting module 1 is inserted into the disposing hole 9a of the feeding attachment 8 from below, and the connecting portions 12a and 12a of the feeding terminals 12 and 12 are pushed against the planar electrode portions 6 and 6 from above and are thus connected thereto. In this state, the holder 13 is slid from the front with respect to the feeding attachment 8, and the base portion 14 and the side portions 15 and 15 in the holder 13 are coupled in contact with a lower surface of the base surface portion 9 (see FIG. 4). A part of the radiating surface 2b of the ceramic board 2 is received from below by the receiving protruded portions 15a and 15a of the holder 13, and the light emitting module 1 is fixed to the feeding attachment 8.

The feeding terminals 12 and 12 are connected to the planar electrode portions 6 and 6 so that the semiconductor light emitting device 3 is electrically connected to the feeding portions 11 and 11 through the conductive patterns 5 and 5, the planar electrode portions 6 and 6, and the feeding terminals 12 and 12.

Figure 5:
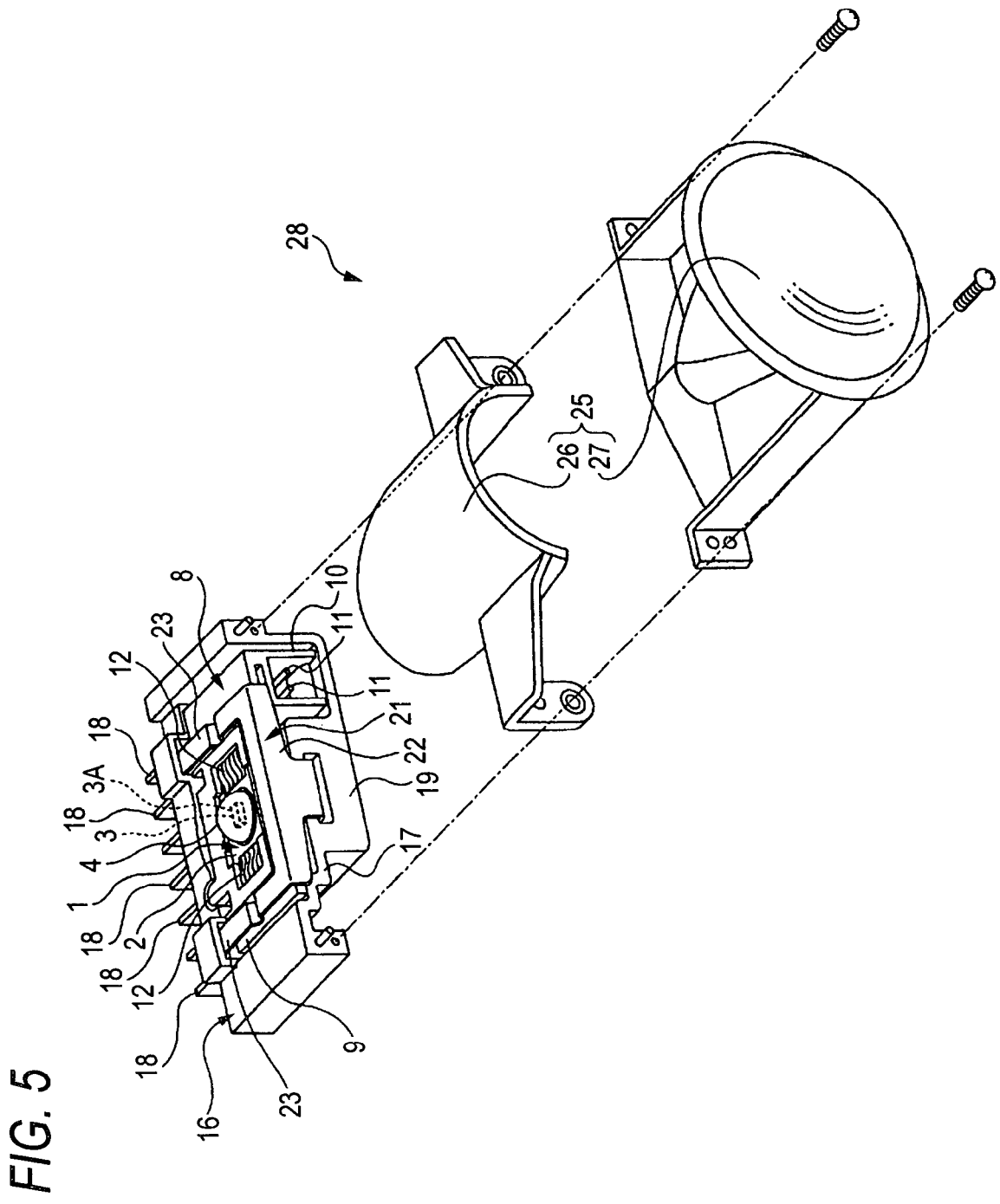
FIG. 5 is a perspective view showing a lighting device for a vehicle, a part of which is exploded.

The feeding attachment 8 to which the light emitting module 1 having the structure described above is connected is fixed to a radiating member 16 (see FIGS. 1 and 5).

In the radiating member 16, respective portions are integrally formed by a metal material having a high thermal conductivity. The radiating member 16 is constituted by a base portion 17, radiating fins 18, 18, . . . protruded rearward from the base portion 17, and an attaching protruded portion 19 protruded downward from the base portion 17 as shown in FIG. 1. The radiating fins 18, 18, . . . are provided transversely apart from each other at an equal interval.

A positioning portion 20 is provided on an upper surface of the base portion 17. The positioning portion 20 has first positioning surfaces 20a and 20a turned forward, and second positioning surfaces 20b and 20b facing each other in a transverse direction.

A rear end of the base portion 17 is provided with insertion holes 17a and 17a which are transversely separated from each other and penetrate longitudinally. An attaching insertion hole 17b is formed on a front surface of the base portion 17, and an engagement hole 17c opened upward is formed in the attaching insertion hole 17b.

The feeding attachment 8 is fixed to the radiating member 16 by means of a clip 21.

In the clip 21, respective portions are integrally formed by a plate-shaped metal material having a spring property (see FIG. 1). The clip 21 is constituted by a coupling portion 22 turned in a longitudinal direction, pressing protruded portions 23 and 23 protruded rearward from an upper edge of the coupling portion 22 respectively, and an inserting protruded portion 24 protruded rearward from a lower edge of the coupling portion 22.

The pressing protruded portions 23 and 23 are protruded rearward from both left and right ends of the coupling portion 22 respectively, and have engagement projections 23a and 23a protruded downward in intermediate parts in a protruding direction respectively. The engagement projections 23a and 23a are formed to be extended transversely.

An engagement protruded piece 24a taking a cut and raised shape is formed on the inserting protruded portion 24. The engagement protruded piece 24a is cut and raised to be protruded forward, obliquely, and downward.

Figure 6:
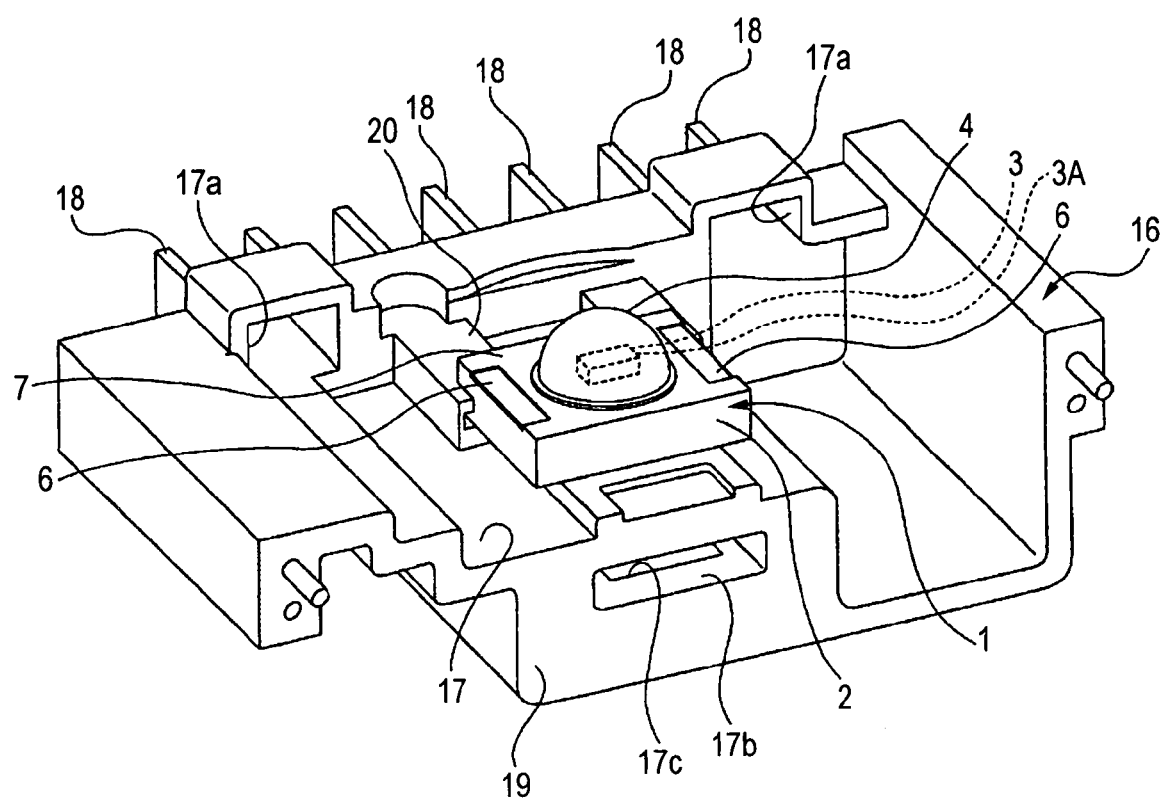
FIG. 6 is a perspective view showing a state in which the light emitting module is positioned in a radiating member.
Figure 7:
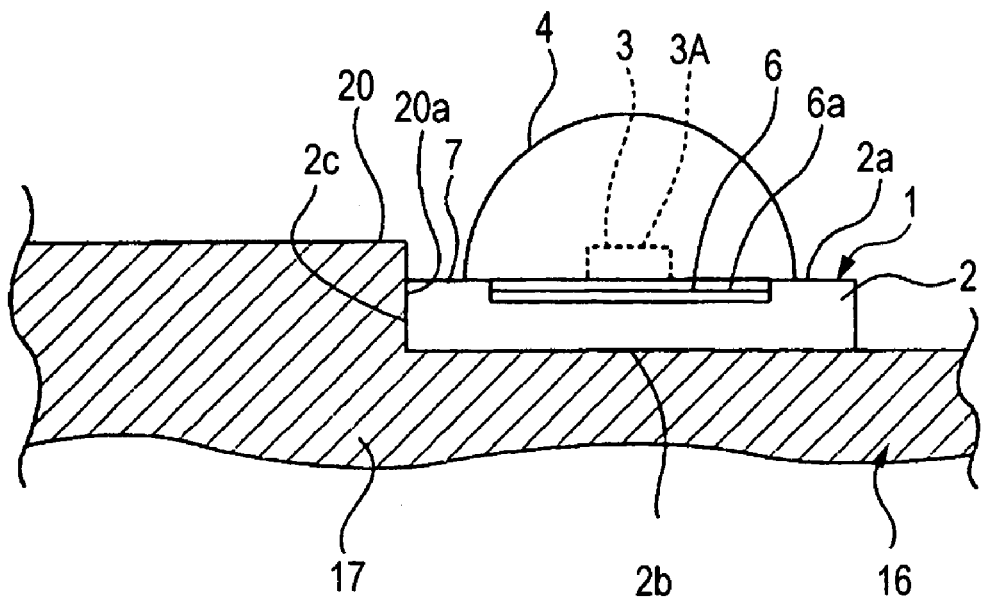
FIG. 7 is a schematic enlarged side view showing, in a section, a part of the state in which the light emitting module is positioned in the radiating member.

The feeding attachment 8 to which the light emitting module 1 is fixed is disposed on the base portion 17 of the radiating member 16. When the feeding attachment 8 is disposed on the base portion 17, the abutting surface 2c of the ceramic board 2 is caused to abut the first positioning surfaces 20a and 20a of the positioning portion 20 from the front so that the light emitting module 1 is positioned in a longitudinal direction with respect to the radiating member 16 (see FIGS. 6 and 7). Respective rear ends of both left and right side surfaces of the ceramic board 2 are caused to abut or approach the second positioning surfaces 20b and 20b of the positioning portion 20 and are positioned in a transverse direction with respect to the radiating member 16, respectively.

In a state in which the light emitting module 1 is positioned with respect to the radiating member 16, the radiating surface 2b of the ceramic board 2 is caused to come in face contact with the radiating member 16.

In the state in which the positioning is carried out, the pressing protruded portions 23 and 23 of the clip 21 are inserted into the insertion holes 17a and 17a of the radiating member 16 from the front respectively, and the inserting protruded portion 24 of the clip 21 is inserted in the attaching insertion hole 17b of the radiating member 16 from the front.

The feeding attachment 8 is pressed by the engagement projections 23a and 23a of the clip 21 and the engagement projecting piece 24a of the clip 21 is engaged with an open edge on a front side of the engagement hole 17c of the radiating member 16, and is thus fixed to the radiating member 16 through the clip 21 (see FIG. 5).

In a state in which the feeding attachment 8 is fixed to the radiating member 16, a connector of a power cord (not shown), which is connected to an external power supply, is connected to the feeding portions 11 and 11 of the feeding attachment 8.

In a state in which the feeding attachment 8, to which the light emitting module 1 is connected, is fixed to the radiating member 16 by means of the clip 21 as described above, an optical component 25 is attached to the radiating member 16 (see FIG. 5). The optical component 25 has a reflector 26 and a projection lens 27. The optical component 25 is attached to the radiating member 16, and both of them are disposed in a lamp housing, which is not shown. Consequently, a lighting device 28 for a vehicle is constituted.

As described above, in the light emitting module 1, the exposure regions 6a and 6a of the pair of planar electrode portions 6 and 6 are positioned in the portions other than the portion linked to the abutting surface 2c in the outer peripheral portion of the device disposing surface 2a of the ceramic board 2. In the state in which the light emitting module 1 is positioned and fixed to the radiating member 16 formed by the metal material, therefore, the planar electrode portions 6 and 6 do not come in contact with the radiating member 16 and the generation of a short circuit can be prevented.

In the light emitting module 1, the pair of planar electrode portions 6 and 6 are formed in the outer peripheral portion positioned on an opposite side with the semiconductor light emitting device 3 interposed therebetween in the ceramic board 2, respectively. Therefore, a design can easily be carried out for the positions in which the feeding terminals 12 and 12 are to be formed in the feeding attachment 8. Thus, the design can be facilitated.

In the light emitting module 1, furthermore, a part of the pair of planar electrode portions 6 and 6 are covered with the insulating layer 7 so that the non-exposure regions 6b, 6b, . . . which are not exposed to the device disposing surface 2a of the ceramic board 2 are formed. Therefore, the exposure regions 6a and 6a and the non-exposure regions 6b, 6b, . . . can easily be formed.

Figure 8:
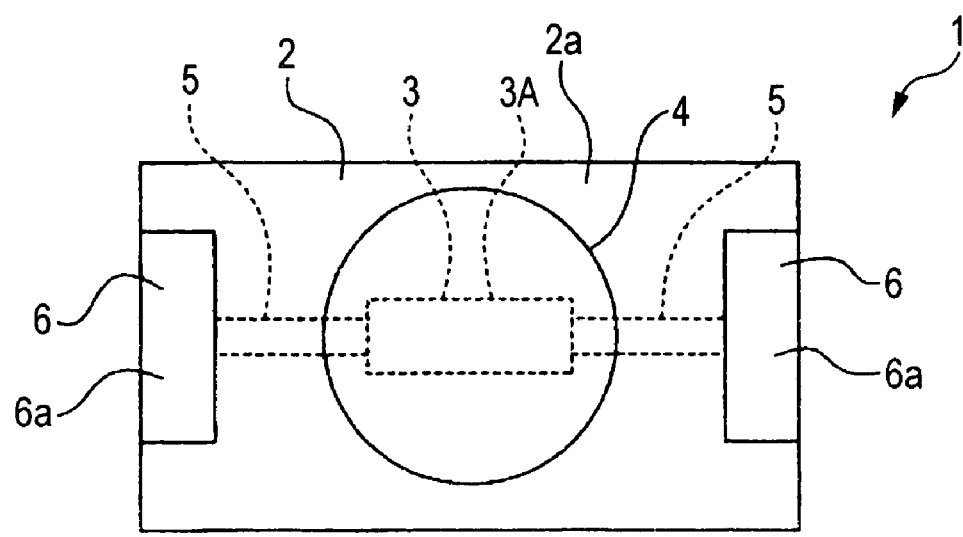
FIG. 8 is an enlarged plan view showing the light emitting module in which planar electrode portions are formed in different positions.

While the description has been given of an example in which the planar electrode portions 6 and 6 are formed on the whole of both ends in the first direction of the ceramic board 2, it is also possible to form the whole planar electrode portions 6 and 6 as the exposure regions 6a and 6a without forming the planar electrode portions 6 and 6 on the end at the Y1 side in the second direction as shown in FIG. 8, for example. In this case, the insulating layer 7 is not required and manufacturing cost can be reduced.

Figure 9:
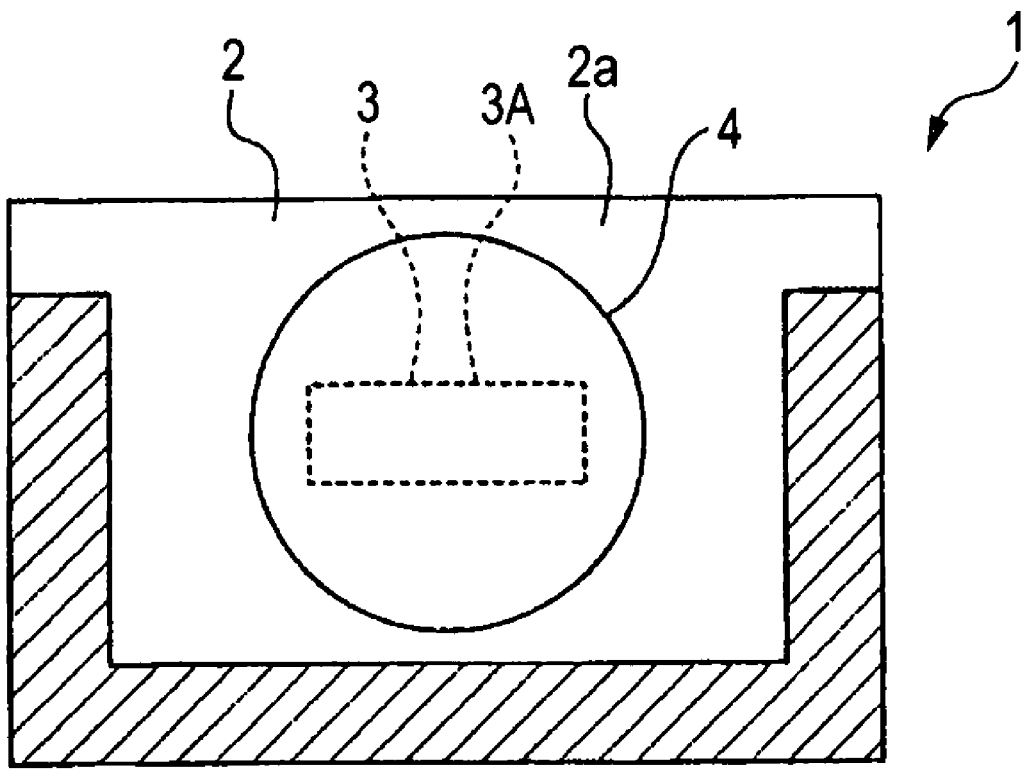
FIG. 9 is an enlarged plan view showing a position in which exposure regions of the planar electrode portions can be formed.
Figure 9:
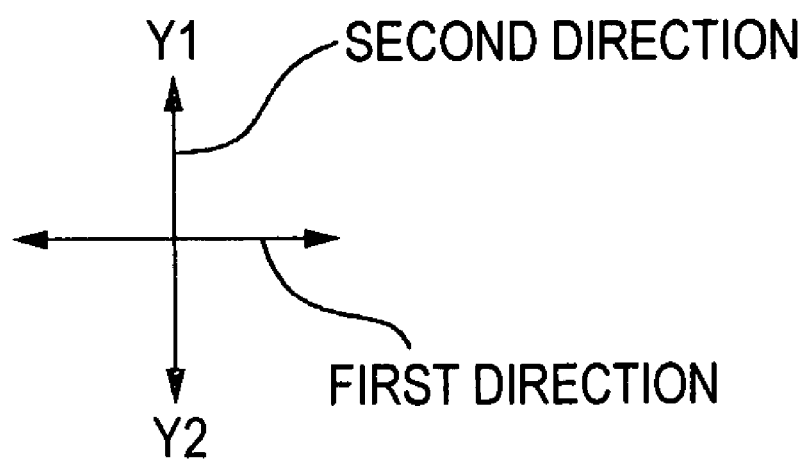

Moreover, it is preferable that the exposure regions 6a and 6a of the planar electrode portions 6 and 6 should not be formed on the ends at the Y1 side in the second direction of the ceramic board 2, but the exposure regions 6a and 6a of the pair of planar electrode portions 6 and 6 should be formed in a portion shown in an oblique line of FIG. 9.

Those skilled in the art will appreciate that the shape and structure of each portion shown in the disclosed embodiments is only illustrative.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

DESCRIPTION OF THE REFERENCE NUMERALS AND SIGNS

1 . . . light emitting module, 2 . . . ceramic board, 2a . . . device disposing surface, 2b . . . radiating surface, 2c . . . abutting surface, 3 . . . semiconductor light emitting device, 3A . . . light emitting portion, 5 . . . conductive pattern, 6 . . . planar electrode portion, 6a . . . exposure region, 6b . . . non-exposure region, 7 . . . insulating layer, 8 . . . feeding attachment, 12 . . . feeding terminal, 16 . . . radiating member, 20a . . . first positioning surface, 25 . . . optical component, 27 . . . projection lens, 28 . . . lighting device for vehicle.

What is claimed is:

1. A light emitting module used in a lighting device for a vehicle and fixed to a radiating member in an abutting and positioning state to a positioning surface formed on the radiating member, the light emitting module comprising:

a ceramic board formed in an almost rectangular shape and having one side surface in an outer peripheral surface formed as an abutting surface, which is caused to abut on the positioning surface of the radiating member, one surface in a vertical direction formed as a device disposing surface, and another surface in the vertical direction formed as a radiating surface, which is provided in face contact with the radiating member to radiate heat;

a predetermined conductive pattern formed on the ceramic board;

a light emitting portion, having a semiconductor light emitting device, disposed on the device disposing surface of the ceramic board and connected to the conductive pattern; and a pair of planar electrode portions formed on the ceramic board and connected to the semiconductor light emitting device through the conductive pattern, wherein at least a part of the pair of planar electrode portions are set to be exposure regions, which are exposed to the device disposing surface of the ceramic board, and the exposure regions of the pair of planar electrode portions are positioned in portions other than a portion linked to the abutting surface in an outer peripheral portion of the device disposing surface.

2. The light emitting module according to claim 1, wherein the pair of planar electrode portions are formed in the outer peripheral portion positioned on an opposite side with the semiconductor light emitting device interposed therebetween.

3. The light emitting module according to claim 2, wherein a part of the pair of planar electrode portions are covered with an insulating layer to form a non-exposure region which is not exposed to the device disposing surface of the ceramic board.

4. The light emitting module according to claim 1, wherein a part of the pair of planar electrode portions are covered with an insulating layer to form a non-exposure region, which is not exposed to the device disposing surface of the ceramic board.

5. The light emitting module according to claim 1, wherein the pair of planar electrode portions comprise a positive electrode portion and negative electrode portion.

6. A lighting device for a vehicle, in which a light emitted from a semiconductor light emitting device of a light emitting module is irradiated as illuminating light through a projection lens, comprising:
   a radiating member having a positioning surface and formed by a predetermined metal material;
   a ceramic board formed in an almost rectangular shape and having one side surface in an outer peripheral surface formed as an abutting surface, which is caused to abut on the positioning surface of the radiating member, one surface in a vertical direction formed as a device disposing surface, and another surface in the vertical direction formed as a radiating surface, which is provided in face contact with the radiating member to radiate heat;
   a predetermined conductive pattern formed on the ceramic board;
   a light emitting portion, having a semiconductor light emitting device, disposed on the device disposing surface of the ceramic board and connected to the conductive pattern;
   a pair of planar electrode portions formed on the ceramic board and connected to the semiconductor light emitting device through the predetermined conductive pattern;
   a feeding attachment for holding the ceramic board and feeding power to the semiconductor light emitting device through the pair of planar electrode portions and the conductive pattern; and
   an optical member for irradiating the light emitted from the semiconductor light emitting device as illuminating light,
   wherein at least a part of the pair of planar electrode portions are set to be exposure regions, which are exposed to the device disposing surface of the ceramic board, and
   the exposure regions of the pair of planar electrode portions are positioned in portions other than a portion linked to the abutting surface in an outer peripheral portion of the device disposing surface.

7. The lighting device for a vehicle according to claim 6, wherein the pair of planar electrode portions comprise a positive electrode portion and negative electrode portion.

8. A lighting device for a vehicle comprising:
   a light emitting module comprising:
      a ceramic board comprising:
         an abutting surface formed on an outer peripheral surface of the ceraminc board, and
         a device disposing surface facing a vertical direction,
         wherein the abutting surface abuts positioning surfaces of a radiating member, and
         planar electrode portions and a predetermined conductive pattern are formed on the device disposing surface of the ceramic board; and
      a semiconductor light emitting device disposed on the device disposing surface of the ceramic board and connected to the planar electrode portions through the predetermined conductive pattern,
      wherein the planar electrode portions comprise exposure regions exposed to the device disposing surface of the ceramic board, and
      wherein the exposure regions are not linked to the abutting surface of the device disposing surface.

9. The lighting device for a vehicle according to claim 8 further comprising:
   a radiating member having a positioning surface and formed by a predetermined metal material; and
   the ceramic board further comprises a radiating surface formed facing the vertical direction,
   wherein the radiating surface of the ceramic board contacts the radiating member to radiate heat.

10. The lighting device for a vehicle according to claim 8 further comprising:
    an optical member for irradiating the light emitted from the semiconductor light emitting device as illuminating light.

11. The lighting device for a vehicle according to claim 8 further comprising:
    a feeding attachment for holding the ceramic board and feeding power to the semiconductor light emitting device through the planar electrode portions and the conductive pattern.

12. The lighting device for a vehicle according to claim 8, wherein the ceramic board is formed in an almost rectangle shape.

13. The lighting device for a vehicle according to claim 8, wherein the planar electrode portions comprise a positive electrode portion and negative electrode portion.

14. The lighting device for a vehicle according to claim 8, wherein the planar electrode portions are formed in the outer peripheral portion positioned on an opposite side with the semiconductor light emitting device interposed therebetween.

15. The lighting device for a vehicle according to claim 8, wherein the planar electrode portions further comprise non-exposure regions, and wherein the non-exposure regions are covered with an insulating layer that isolates the non-exposure regions from the device disposing surface of the ceramic board.

* * * * *